(12) United States Patent
Tang

(10) Patent No.: US 11,462,587 B2
(45) Date of Patent: Oct. 4, 2022

(54) DISPLAY PANEL AND FABRICATING METHOD THEREOF

(71) Applicants: BOE TECHNOLOGY GROUP CO., LTD., Beijing (CN); CHENGDU BOE OPTOELECTRONICS TECHNOLOGY, Sichuan (CN)

(72) Inventor: Guoqiang Tang, Beijing (CN)

(73) Assignees: Chengdu BOE Optoelectronics Technalgy Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 440 days.

(21) Appl. No.: 16/499,496

(22) PCT Filed: Apr. 9, 2019

(86) PCT No.: PCT/CN2019/081888
§ 371 (c)(1),
(2) Date: Sep. 30, 2019

(87) PCT Pub. No.: WO2020/042616
PCT Pub. Date: Mar. 5, 2020

(65) Prior Publication Data
US 2021/0366990 A1    Nov. 25, 2021

(30) Foreign Application Priority Data
Aug. 31, 2018   (CN) .................. 201811012529.X

(51) Int. Cl.
*G06K 9/00* (2022.01)
*H01L 27/28* (2006.01)
*H01L 27/30* (2006.01)
*H01L 27/32* (2006.01)
*H01L 51/00* (2006.01)
*H01L 51/42* (2006.01)
(Continued)

(52) U.S. Cl.
CPC ........ *H01L 27/288* (2013.01); *G06V 40/1318* (2022.01); *H01L 27/307* (2013.01);
(Continued)

(58) Field of Classification Search
CPC . H01L 27/288; H01L 27/307; H01L 27/3244; H01L 51/0036; H01L 51/0047;
(Continued)

(56) References Cited

U.S. PATENT DOCUMENTS

2016/0232397 A1*   8/2016   Yu ........................ H01L 31/173
2017/0091506 A1*   3/2017   Sinha .................. G06V 40/1335
(Continued)

FOREIGN PATENT DOCUMENTS

CN    101101971 A    1/2008
CN    101635276 A    1/2010
(Continued)

OTHER PUBLICATIONS

International Search Report issued to PCT Application No. PCT/CN2019/081888 dated Jul. 2, 2019, (9p).
(Continued)

*Primary Examiner* — Abdul-Samad A Adediran
(74) *Attorney, Agent, or Firm* — Arch & Lake LLP

(57) ABSTRACT

A display panel and a fabricating method thereof are provided. The display panel includes: a substrate; and an array of pixels on the substrate, each pixel having a sub-pixel region and a photosensitive region, wherein the sub-pixel region includes a light emitting structure; the photosensitive region is configured to sense light emitted by the light emitting structure and reflected by a finger; and the photosensitive region includes a photosensitive thin film transistor having a vertical channel with respect to the substrate.

18 Claims, 4 Drawing Sheets

(51) Int. Cl.
  *H01L 51/44* (2006.01)
  *H01L 51/56* (2006.01)
  *G06V 40/13* (2022.01)

(52) U.S. Cl.
  CPC ...... *H01L 27/3244* (2013.01); *H01L 51/0036* (2013.01); *H01L 51/0047* (2013.01); *H01L 51/428* (2013.01); *H01L 51/444* (2013.01); *H01L 51/56* (2013.01); *H01L 2227/323* (2013.01)

(58) Field of Classification Search
  CPC ....... H01L 51/428; H01L 51/44; H01L 51/56; H01L 2227/323; H01L 31/173; H01L 27/3211; G06V 40/1318; G06V 40/1335
  See application file for complete search history.

(56) References Cited

U.S. PATENT DOCUMENTS

2017/0337418 A1  11/2017  Wang et al.
2018/0060641 A1*  3/2018  Kim ................. G06V 40/13
2019/0019850 A1*  1/2019  Xu ..................... H01L 27/3211
2019/0072796 A1   3/2019  Li

FOREIGN PATENT DOCUMENTS

| | | |
|---|---|---|
| CN | 104573648 A | 4/2015 |
| CN | 107134259 A | 9/2017 |
| CN | 107331689 A | 11/2017 |
| CN | 107591480 A | 1/2018 |
| CN | 107611180 A | 1/2018 |
| CN | 107785403 A | 3/2018 |
| WO | WO 2018/153068 * | 8/2018 .......... H01L 27/3211 |

OTHER PUBLICATIONS

First Office Action issued to Chinese Application No. 201811012529.X dated Oct. 11, 2021 with English translation, (15p).

* cited by examiner

DISPLAY PANEL AND FABRICATING METHOD THEREOF

CROSS REFERENCE TO RELATED APPLICATIONS

The present application is the U.S. national phase of PCT Application No. PCT/CN2019/081888 filed on Apr. 9, 2019 which is based on and claims priority from Chinese Patent Application No. 201811012529.X, filed on Aug. 31, 2018, the entire contents of which are incorporated herein by reference.

TECHNICAL FIELD

Embodiments of the present disclosure relate to a display panel and a method of fabricating the same.

BACKGROUND

In the field of display, organic light-emitting diode (OLED) display panels have the characteristics of self-luminous, high contrast, low power consumption, wide viewing angle, fast response, flexible panel, wide temperature range, simple manufacturing process, etc., and thus have a good prospect of development. With the development of fingerprint recognition technology, how to apply fingerprint recognition technology to OLED display panels is a problem that has attracted much attention in the industry.

SUMMARY

A display panel and a fabricating method thereof are disclosed.

According to a first aspect of the present disclosure, there is provided a display panel, the display panel including: a substrate; and an array of pixels on the substrate, each pixel having a sub-pixel region and a photosensitive region, wherein the sub-pixel region includes a light emitting structure; the photosensitive region is configured to sense light emitted by the light emitting structure and reflected by a finger; and the photosensitive region includes a photosensitive thin film transistor having a vertical channel with respect to the substrate.

The display panel may further include an insulating layer over the photosensitive thin film transistor, and the light emitting structure may be disposed over the insulating layer.

The photosensitive thin film transistor may include a gate electrode, a gate insulating layer, a first electrode, an active layer, and a second electrode sequentially formed over the substrate.

The active layer may include a photosensitive layer.

The photosensitive layer may include a material of poly (3-hexylthiophene) (P3HT) and [6,6]-phenyl-C 61-butyric acid methyl ester (PCBM) composite.

The active layer may further include a semiconductor layer between the photosensitive layer and the first electrode.

The semiconductor layer may include dinaphtho[2,3-b:2', 3'-f]thieno[3,2-b]thiophene (DNTT) or pentacene.

A material of the first electrode may be a porous semiconductor electrode material.

A material of the first electrode may be carbon nanotubes.

A material of the second electrode may be a transparent conductive material.

The photosensitive region may further include a first electrode lead electrically connected to the first electrode; and the first electrode may include a first portion and a second portion, the first portion covering the first electrode lead with respect to the substrate, the second portion and the first electrode lead being arranged side by side with respect to the substrate.

The sub-pixel region may further include a first transistor, and a source or a drain of the first transistor may be electrically connected to a first electrode of the light emitting structure.

A gate of the first transistor may be in a same layer as the gate electrode of the photosensitive thin film transistor.

The photosensitive region may further include a second electrode lead electrically connected to the second electrode of the photosensitive thin film transistor, and the second electrode lead may be in a same layer as the source or the drain of the first transistor.

The photosensitive thin film transistor may be distal from the substrate relative to an active layer of the first transistor.

The sub-pixel region may include a plurality of sub-pixels, each sub-pixel having a size substantially equal to a size of the photosensitive region.

The display panel may further include a filter layer over the second electrode of the photosensitive thin film transistor, the filter layer covering the photosensitive thin film transistor.

According to a second aspect of the present disclosure, there is provided a method of fabricating a display panel, the method including: providing a substrate; and forming an array of pixels on the substrate, each pixel having a sub-pixel region and a photosensitive region; wherein the sub-pixel region includes a light emitting structure; the photosensitive region is configured to sense light emitted by the light emitting structure and reflected by a finger; and the photosensitive region includes a photosensitive thin film transistor having a vertical channel with respect to the substrate.

The method may further include forming an insulating layer over the photosensitive thin film transistor; and forming the light emitting structure over the insulating layer.

The method may further include forming the photosensitive thin film transistor by sequentially forming a gate electrode, a gate insulating layer, a first electrode, an active layer, and a second electrode over the substrate.

BRIEF DESCRIPTION OF DRAWINGS

A more particular description of the embodiments will be rendered with reference to specific embodiments illustrated in the appended drawings. Given that these drawings depict only some embodiments and are not therefore considered to be limiting in scope, the embodiments will be described and explained with additional specificity and details through the use of the accompanying drawings, in which.

DETAILED DESCRIPTION OF EMBODIMENTS

Figure 1A:
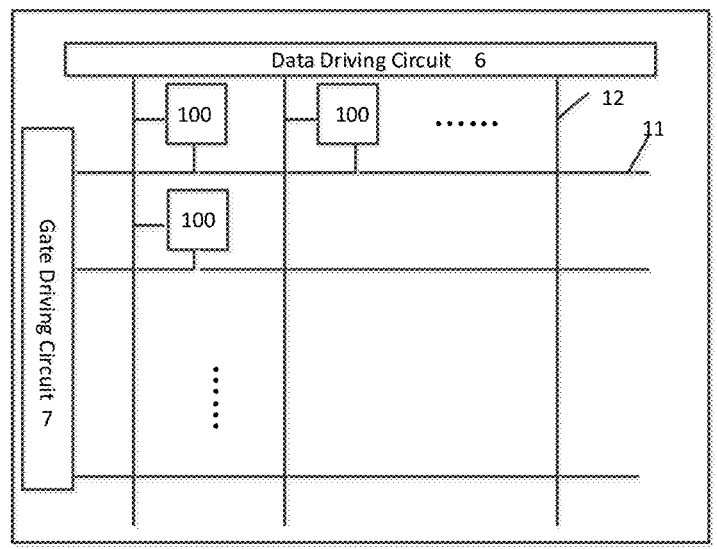
FIG. 1A is a schematic plan view of a display panel according to an embodiment of the present disclosure.

The disclosure will be described hereinafter with reference to the accompanying drawings, which illustrate embodiments of the disclosure. The described embodiments are only exemplary embodiments of the present disclosure, but not all embodiments. Other embodiments may be obtained by a person of ordinary skill in the art based on the embodiments of the present disclosure without creative efforts, and are within the scope of the present disclosure.

References throughout the disclosure to "one embodiment", "an embodiment", "an example", "some embodiments", or similar language mean that a particular feature, structure, or characteristic described in connection with the embodiment is included in at least one embodiment. Thus, appearances of the phrases "in one embodiment", "in an embodiment", "in some embodiments", and similar language throughout the disclosure may, but do not necessarily, all refer to the same embodiment(s), but mean "one or more embodiments". These may or may not include all the embodiments disclosed.

Unless otherwise defined, technical terms or scientific terms used in the embodiments of the present disclosure should be construed in the ordinary meaning of the person of ordinary skill in the art.

The terms "first", "second" and similar terms used in the present disclosure do not denote any order, quantity, or importance. They are merely used for references to relevant devices, components, procedural steps, etc. These terms do not imply any spatial or chronological orders, unless expressly specified otherwise. For example, a "first device" and a "second device" may refer to two separately formed devices, or two parts or components of the same device. Similarly, a "first step" of a method or process may be carried or performed after, or simultaneously with, a 'second step".

The terms "comprising", "including", "having", and variations thereof mean "including but not limited to", unless expressly specified otherwise.

An enumerated listing of items does not imply that any or all of the items are mutually exclusive, unless expressly specified otherwise. The terms "a", "an", and "the" also refer to "one or more" unless expressly specified otherwise.

The words "connected" or "connection" and the like are not limited to physical or mechanical connections, but may include electrical connections, whether direct or indirect.

The words "over" is used only to indicate that a layer's relative position with respect to another layer, which means that the layer is located further from the substrate than the other. This does not necessarily require contact of the two layers, nor does it require the layer fully or partially covering the other layer.

A display panel may be provided with fingerprint recognition function with an external structure or an in-display structure. The external structure refers to attaching a fingerprint recognition module to somewhere outside a display area of the display panel. Such structure requires additional preparation of a fingerprint recognition module (for example, a capacitive fingerprint recognition module), and results in a bulky final product. The in-display structure refers to the integration of the fingerprint recognition module into the display panel, and such structure may realize fingerprint recognition under the screen. However, since the in-display structure may have compatibility issues with the manufacturing process of the display panel, how to produce a fingerprint recognition module having high light responsivity and high signal-to-noise ratio and how to optimize the manufacturing process are issues to be considered.

At least one embodiment of the present disclosure provides a display panel and a method of fabricating the same. The display panel integrates a photosensitive region in a display screen, and the photosensitive region is formed by using a photosensitive thin film transistor having a vertical channel. The in-display structure achieves fingerprint recognition under the screen, or full-screen fingerprint recognition. In addition, the photosensitive thin film transistor has a relatively large photosensitive area (aperture ratio) and a relatively short channel length. Thus, the light responsivity and signal-to-noise ratio of the display panel may be improved.

Figure 1B:
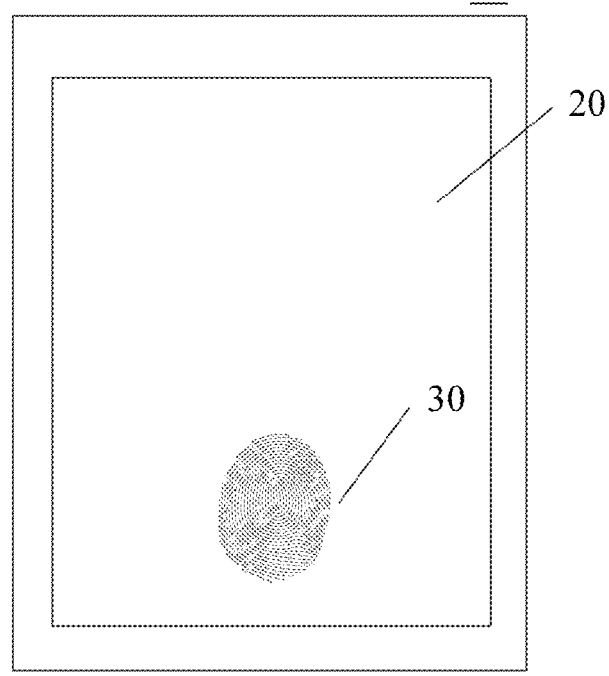
FIG. 1B is another schematic plan view of the display panel.
Figure 2:
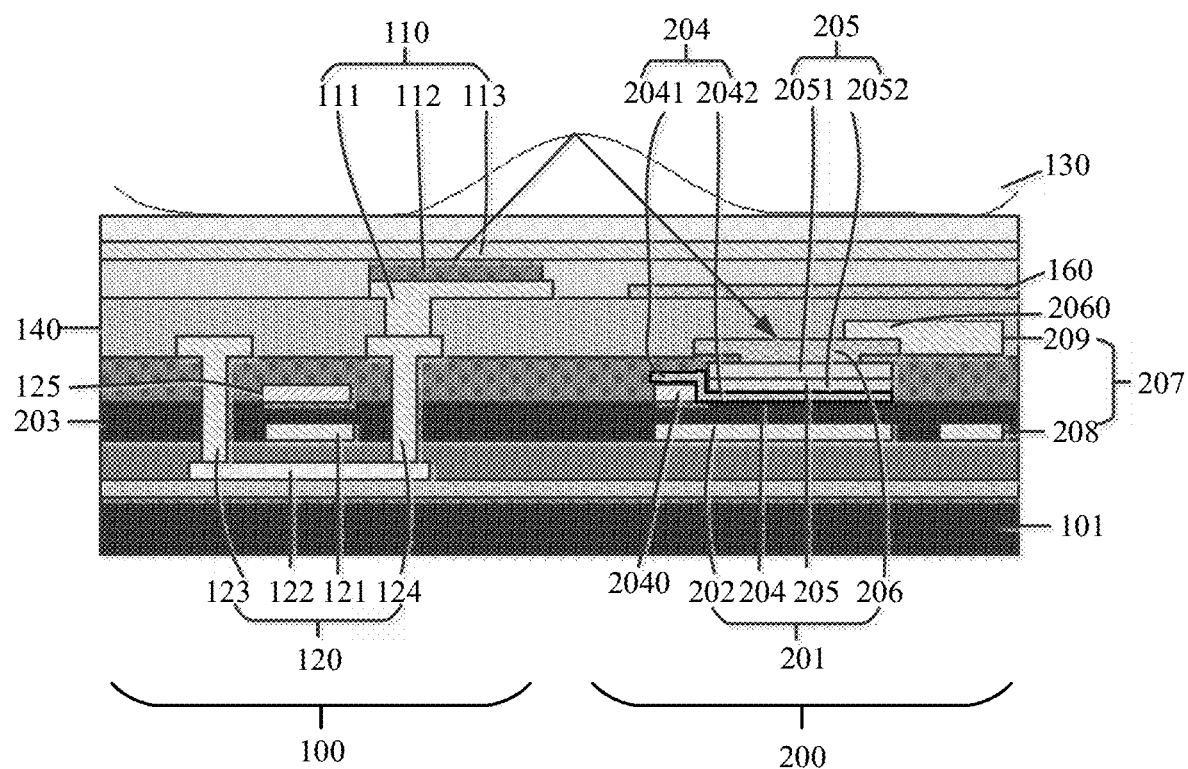
FIG. 2 is a partial cross-sectional view of a fingerprint recognition area of the display panel in FIG. 1A or FIG. 1B.

FIG. 1A is a schematic plan view of a display panel 10 according to an embodiment of the present disclosure; FIG. 1B is another schematic plan view of the display panel; and FIG. 2 is a partial cross-sectional view of a fingerprint recognition area of the display panel in FIG. 1A or FIG. 1B. For clarity purpose, only a portion of one sub-pixel region of the fingerprint recognition area is shown in FIG. 2. Referring to FIG. 1A, FIG. 1B and FIG. 2, the display panel 10 includes a plurality of gate lines 11, a plurality of data lines 12, and a plurality of sub-pixel regions 100 arranged in an array. The plurality of gate lines 11 and the plurality of data lines 12 intersect to define a plurality of pixel regions, and the plurality of sub-pixel regions 100 are arranged in the plurality of pixel regions in one-to-one correspondence. Each of the sub-pixel regions 100 includes a light emitting structure 110 and a pixel circuit that drives the light emitting structure 110 to emit light.

The display panel 10 includes a display area 20 that includes a fingerprint recognition area 30. The fingerprint recognition area 30 may be part or all of the display area 20.

For example, the display panel 10 is an organic light emitting diode (OLED) display panel, and the light emitting structure 110 is an organic light emitting diode. For example, the pixel circuit includes a conventional 2T1C pixel circuit, and in various embodiments, it may further include a compensation circuit that includes an internal compensation circuit or an external compensation circuit. The compensation circuit may include a transistor, a capacitor, or the like. The pixel circuit may further include a reset circuit or the like if required.

For example, as shown in FIG. 1A, the display panel 10 may further include a data driving circuit 6 and a gate driving circuit 7, which are connected to the sub-pixel regions 100 through the data lines 12 and the gate lines 11 respectively. The data driving circuit provides a data signal; and the gate driving circuit provides a scanning signal and may further provide various control signals, power signals, and the like.

For example, each of the sub-pixel regions 100 includes a plurality of sub-pixels, each sub-pixel including a light emitting structure 110 that emits light of a different color, thereby achieving color display. For example, one sub-pixel region 100 includes three sub-pixels of RGB, and the three sub-pixels include three light emitting structures 110 that emit red, green, and blue light respectively.

As shown in FIG. 2, the display panel 10 includes a substrate 101 on which the plurality of sub-pixel regions 100 are disposed. The display panel 10 further includes a photosensitive region 200 disposed on the substrate 101, and the photosensitive region 200 is configured to sense light emitted by the light emitting structure 110 and reflected by a finger detected on the surface of the display panel 10, thereby realizing fingerprint recognition function or touch sensing function. The photosensitive region 200 includes a photosensitive thin film transistor 201, which may convert an optical signal into an electrical signal to implement functions such as fingerprint recognition or touch sensing.

Taking the photosensitive region implementing a fingerprint recognition function as an example, in normal operation, the light emitted by the light emitting structure 110, after being reflected by the surface of a finger 130, is received by the photosensitive thin film transistor 201 in the photosensitive region 200 and converted into an electrical signal. Since the valley of the fingerprint (a recessed surface) and the ridge of the fingerprint (a convex surface) for the finger 130 have different light reflectivities, light of different intensities is reflected, thereby generating electrical signals of different magnitudes. The photosensitive region 200 transmits the electrical signals to an external processing circuit (e.g., a fingerprint processing chip, not shown) for analysis to obtain a fingerprint image of the surface of the finger, the fingerprint image being further used for fingerprint recognition. For example, each of a plurality of photosensitive regions 200 in the fingerprint recognition area 30 receives light reflected by a corresponding region of the finger 130 to collect a fingerprint image of the corresponding region, and the collected fingerprint images are then pieced into a complete fingerprint image.

For example, in the fingerprint recognition area 30 of the display area 20, each of the sub-pixel regions 100 corresponds to a display pixel, which may comprise three sub-pixels in a typical embodiment. Accordingly, each sub-pixel region is configured with one photosensitive region 200, that is, the display panel 10 includes a plurality of photosensitive regions 200 each in a one-to-one relation with one of the plurality of sub-pixel regions 100, i.e. a display pixel, and the photosensitive regions 200 themselves are also arranged in an array, forming an image sensor to capture a fingerprint image. Each of the photosensitive regions 200 is configured to sense light emitted from the corresponding sub-pixel region 100 and reflected by the detected finger.

Figure 3A:
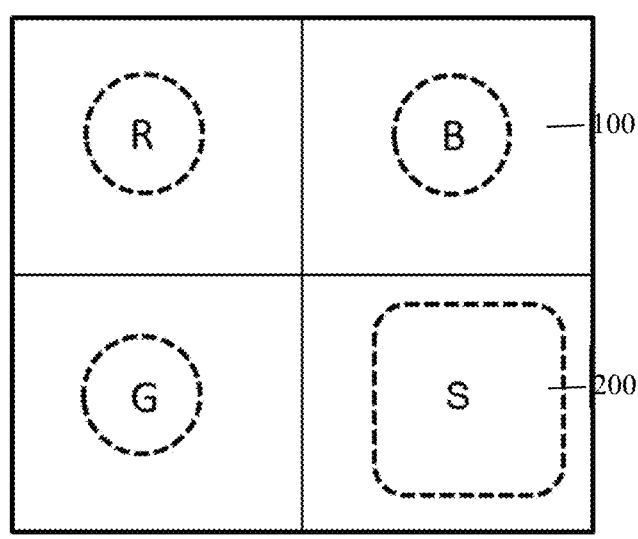
FIG. 3A is a schematic diagram of a pixel structure in the fingerprint recognition area.

Referring to FIG. 3A, a sub-pixel region 100 in the fingerprint recognition area 30 includes three sub-pixels of RGB. The three sub-pixels include three light emitting structures that emit red, green, and blue light respectively, and a photosensitive region S is disposed in the sub-pixel region. Each sub-pixel has a size substantially equal to a size of the photosensitive region.

According to an embodiment of the present disclosure, the display panel includes: a substrate; and an array of pixels on the substrate, each pixel having a sub-pixel region and a photosensitive region, wherein the sub-pixel region includes a light emitting structure; the photosensitive region is configured to sense light emitted by the light emitting structure and reflected by a finger; and the photosensitive region includes a photosensitive thin film transistor having a vertical channel with respect to the substrate.

As shown in FIG. 2, each sub-pixel of the sub-pixel region 100 further includes a first transistor 120 in direct electrical connection with the light emitting structure 110. The first transistor may be, for example, a driving transistor for driving the light emitting structure 110 to emit light in the pixel circuit, a light emitting control transistor controlling flow of the current that drives the light emitting element 110 to emit light, or the like, which is not limited by the embodiments of the present disclosure.

For example, the display panel 10 further includes an insulating layer 140. With respect to the substrate 101, the photosensitive thin film transistor 201 is disposed under the insulating layer 140 (i.e. the insulating layer is disposed over the photosensitive thin film transistor), and the light emitting structure 110 is disposed over the insulating layer 140. This structure allows the photosensitive thin film transistor 201 to be formed before the light emitting structure 110. Since the light emitting structure 110 generally includes an organic material, which has limited temperature tolerance, compared with forming the photosensitive thin film transistor after or simultaneously with the formation of the light emitting structure, the photosensitive thin film transistor is formed before the formation of the light emitting structure such that the fabrication process of the photosensitive thin film transistor 201 is not restricted by the temperature tolerance of the light emitting structure 110 and can be more flexible. For example, the insulating layer 140 is configured as a planarization layer such that the light emitting structure 110 is formed on a flat surface. Meanwhile, this is advantageous in increasing the area occupied by the light emitting structure 110 and improving the display effect of the display panel.

As shown in FIG. 2, the photosensitive thin film transistor 201 includes a gate electrode 202, a gate insulating layer 203, a first electrode 204, an active layer 205, and a second electrode 206, which are sequentially formed over the substrate 101. The photosensitive thin film transistor 201 has a vertical channel with respect to the substrate 101, that is, the direction of the channel from the source to the drain is perpendicular to the plate surface of the substrate 101. Compared with the thin film transistor having a horizontal channel, the vertical channel structure allows the photosensitive area of the photosensitive thin film transistor 201 (that is, the planar area of the second electrode 206) and the channel length to be independent from each other, so that it is possible to have a shorter channel length with a larger photosensitive area, thereby improving the light responsivity and the signal-to-noise ratio of the photosensitive region 200.

The light emitting structure 110 includes a first electrode 111, a light-emitting layer 112, and a second electrode 113. One of the first electrode 111 and the second electrode 113 is an anode, and the other is a cathode. The light-emitting layer 112 may be an organic light-emitting layer or a quantum dot light-emitting layer. For example, the light emitting structure 110 may include a hole injection layer, a hole transport layer, an electron injection layer, an electron transport layer, or the like, besides the light-emitting layer 112. For example, when the light-emitting layer 112 is an organic light-emitting layer, it may be made of a polymer light-emitting material or a small molecule light-emitting material. The light emitting structure 110 is a top emission structure with the first electrode 111 being reflective and the second electrode 113 being transmissive or semi-transmissive. For example, the first electrode 111, which serves as an anode, is made of a high work function material, such as an ITO/Ag/ITO laminate structure; and the second electrode 113, which serves as a cathode, is made of a low work function material, such as a semi-transmissive metal or metal alloy, e.g., an Ag/Mg alloy material.

The first transistor 120 includes a gate 121, an active layer 122, a source 123, and a drain 124. The type, material, and/or structure of the first transistor 120 are not limited by the embodiments of the present disclosure. For example, it may be a top gate type, a bottom gate type, or the like. The active layer 122 of the first transistor 120 may be made of amorphous silicon or polycrystalline silicon (low-temperature polycrystalline silicon or high temperature polycrystalline silicon), an oxide semiconductor (e.g., IGZO), etc., and the first transistor 120 may be N-type or P-type.

The active layer 205 of the photosensitive thin film transistor 201 includes a photosensitive layer 2051, which generates photo-generated carriers with light irradiation. The photo-generated carriers are collected by a photosensing circuit (not shown) to be converted into an electrical signal, which is output to an external processing circuit to be analyzed to obtain a fingerprint image.

For example, the photosensitive layer 2051 is made of a semiconductor material, and can generate an electric charge in the presence of the gate electric field. In this case, the photosensitive thin film transistor 201 has both a photosensitive function and a switching function.

For example, a material of the photosensitive layer 2051 is poly(3-hexylthiophene) (P3HT), which is an organic material having both photosensitivity and semiconductor properties. To improve the photosensitivity of the P3HT material, it may be doped with [6,6]-phenyl-C 61-butyric acid methyl ester (PCBM) to form a photosensitive layer 2051 comprising a material of P3HT and PCBM composite.

For example, in order to increase the signal intensity outputted by the photosensitive thin film transistor 201, the active layer 205 may further be provided with a semiconductor layer 2052. For example, as shown in FIG. 2, the semiconductor layer 2052 is disposed between the photosensitive layer 2051 and the first electrode 204. The semiconductor layer 2052 is configured to generate carriers under the electric field generated by the gate voltage, thereby increasing the signal intensity output from the photosensitive thin film transistor 201. For example, the semiconductor layer 2052 may be disposed between the photosensitive layer 2051 and the second electrode 206. In his case, the semiconductor layer 2052 is made of a light transmissive material so that the photosensitive layer 2051 can receive and sense the light.

For example, in order to improve the uniformity and stability of the photosensitive thin film transistor 201, the semiconductor layer 2052 is made of an amorphous semiconductor material. For example, the material of the semiconductor layer 2052 is an organic semiconductor material, such as dinaphtho[2,3-b:2',3'-f]thieno[3,2-b]thiophene (DNTT) or pentacene, or an inorganic semiconductor material, such as amorphous silicon or an oxide semiconductor (e.g., IGZO). For example, the material of the first electrode 204 is a porous semiconductor electrode material. On one hand, the porous semiconductor electrode material is sparse and does not completely shield the electric field formed by the voltage applied to the gate electrode 202; on the other hand, the semiconductor electrode material has a moderate electronic density of states (DOS) such that it can conduct electricity, and, at the same time, allows the gate electrode 202 to regulate the charge injection to the active layer 205 by the first electrode 204. This property of the material allows control of the operational state of the photosensitive thin film transistor 201 by applying a voltage to the gate electrode. For example, the material of the first electrode 204 is carbon nanotubes. A plurality of carbon nanotubes is arranged to form a sparse structure, and the adjacent carbon nanotubes have a gap therebetween, which may reduce the shielding of the electric field formed by the voltage applied to the gate electrode; in the meantime, the carbon nanotubes, which are a semiconductor material having a moderate electronic density of states, allow the gate electrode 202 to regulate the charge injection to the active layer 205 by the first electrode 204 while conducting electricity, thereby allowing control of the operational state of the photosensitive thin film transistor 201 by applying a voltage to the gate electrode 202.

For example, the material of the second electrode 206 is a transparent conductive material through which the reflected light received reaches the active layer 205. By increasing the planar area of the second electrode 206, the photosensitive area of the photosensitive thin film transistor 201 can be increased, thereby improving the luminous flux and signal-to-noise ratio of the photosensitive thin film transistor 201. For example, the material of the second electrode 206 is an ultra-thin metal, carbon nanotubes, graphene, silver nanowires, or transparent oxide conductive material such as indium tin oxide (ITO), indium gallium zinc oxide (IGZO) or the like.

For example, the photosensitive region 200 further includes a first electrode lead 2040 electrically connected to the first electrode 204 of the photosensitive thin film transistor 201, the first electrode 204 including a first portion 2041 and a second portion 2042. The first portion 2041 is disposed on and covers the first electrode lead 2040 with respect to the substrate 101 to achieve lapping (electrical connection), and the second portion 2042 and the first electrode lead 2040 are arranged side by side with respect to the substrate 101, that is, the second portion 2041 is disposed adjacent to the first electrode lead 2040 on the gate insulating layer 203.

For example, the photosensitive region 200 further includes a second electrode lead 2060 electrically connected to the second electrode 206 of the photosensitive thin film transistor 201. The first electrode lead 2040 and the second electrode lead 2060 are used to electrically connect the first electrode 204 and the second electrode 206 to other elements respectively.

For example, the sub-pixel region 100 further includes a first conductive layer 125 disposed above the gate 121 of the first transistor 120 and spaced apart from the gate 121 to form a first capacitor, that is, an electrode of the first capacitor and the gate 121 of the first transistor are electrically connected and integrally formed to store or maintain the electrical level of the gate 121.

For example, the gate 121 of the first transistor 120, disposed in the same layer as the gate electrode 202 of the photosensitive thin film transistor 201, is insulated from the gate electrode 202.

For example, the second electrode lead 2060 is disposed in the same layer as the source 123 or the drain 124 of the first transistor 120.

For example, the first electrode lead 2040 disposed in the same layer as the first conductive layer 125 is insulated from the first conductive layer 125.

It should be noted that "disposed in the same layer" in the embodiments of the present disclosure means that two or more structures are formed by the same patterning process using the same material, and it does not necessarily mean having the same height or being formed on the same surface.

It should also be noted that since the source 123 and the drain 124 of the first transistor 120 are physically symmetrical as shown in FIG. 2, the two may be interchangeable according to circuit connections.

For example, the photosensitive thin film transistor 201 is disposed above the active layer 122 of the first transistor 120 with respect to the substrate 101, i.e. the photosensitive thin film transistor is distal from the substrate relative to an active layer of the first transistor. Since the active layer 122 generally occupies a large area in the layout, the photosensitive thin film transistor 201 according to the embodiments of the present disclosure is arranged above the active layer 122 to avoid the photosensitive thin film transistor 201 squeezing the space of the active layer 122, thereby facilitate layout design.

For example, the display panel 10 further includes a filter layer 160 disposed on a side of the second electrode 206 of the photosensitive thin film transistor 201 away from the substrate 101 and covering the photosensitive thin film transistor 201. That is, the filter layer is over the second electrode of the photosensitive thin film transistor. For example, the filter layer 160 is disposed on the insulating layer 140. The filter layer 160 is configured such that the photosensitive layer 2051 of the photosensitive thin film transistor 201 only senses light of a certain color, thereby improving the recognition accuracy of the photosensitive thin film transistor 201. Since the fingerprint is identified by detecting light intensity in fingerprint recognition technology, the uniformity of the intensity of the light emitted by the light source affects the accuracy of the recognition. By providing the filter layer 160, the light received by the photosensitive thin film transistor 201 is filtered to be monochromatic, that it, the received light is filtered and become light of a same color as that of the light emitted by a sub-pixel in the sub-pixel region, thereby preventing differences in light intensity resulted from the received light being emitted by different sub-pixels. For example, the color of the filter layer 160 is one of red, green, and blue. For example, the material of the filter layer 160 is a resin material or the like.

For example, the photosensitive region 200 further includes a second capacitor 207, and the second capacitor 207 includes a first electrode 208 and a second electrode 209. As shown in FIG. 2, the first electrode 208 is disposed in the same layer as the gate electrode 202 of the photosensitive thin film transistor 201, and is insulated from the gate electrode 202; and the second electrode 209 is disposed in the same layer as the second electrode lead 2060 of the photosensitive thin film transistor 201, and is electrically connected to the second electrode lead 2060. For example, the second electrode 209 of the second capacitor 207 is integrally formed with the second electrode lead 2060 of the photosensitive thin film transistor 201. In one example, the second capacitor 207 and the photosensitive thin film transistor 201 form a photo-sensing circuit 210 shown in FIG. 3B.

Figure 3B:
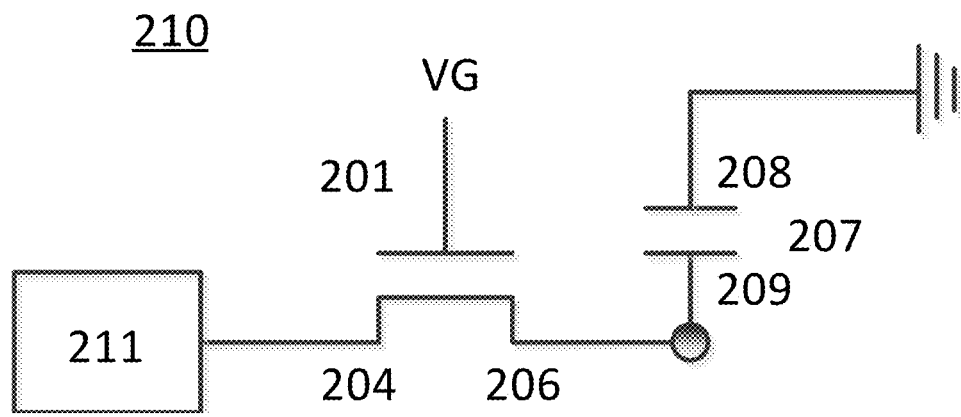
FIG. 3B is a schematic diagram of a photo-sensing circuit provided by an embodiment of the present disclosure.

As shown in FIG. 3B, the photo-sensing circuit 210 according to an embodiment of the present disclosure includes the photosensitive thin film transistor 201 and the second capacitor 207. The second electrode 206 of the photosensitive thin film transistor 201 and the second electrode 209 of the second capacitor 207 are connected electrically. The first electrode 204 of the photosensitive thin film transistor 201 is electrically connected to a processing circuit 211, and the first electrode 204 is connected to the external processing circuit 211 through the first electrode lead 2040 (read signal line). The gate electrode 202 of the photosensitive thin film transistor 201 is connected to a control signal VG through a scanning signal line. The first electrode 208 of the second capacitor 207 may be connected to a fixed potential. For example, the first electrode 208 of the second capacitor 207 is grounded.

A working process of the photo-sensing circuit 210 includes the following. In the reset phase, the control signal VG is an ON signal; the photosensitive thin film transistor 201 is turned on; and the processing circuit 211 writes a reset signal to the second capacitor 207 via the photosensitive thin film transistor 201 to reset the second capacitor 207. In the photosensitive phase, the control signal VG is an OFF signal; the photosensitive thin film transistor 201 is turned off; the photosensitive layer 2051 generates photo-generated carriers with the irradiation of the reflected light; the processing circuit 211 applies a bias voltage to the first electrode 204 via the read the signal line, to generate an electric field between the first electrode 204 and the second electrode 206 of the photosensitive thin film transistor 201; under the electric field, the photo-generated carriers are transported to and gathered on the second electrode 209 of the second capacitor 207 such that the second capacitor is charged and a data voltage Vdata is generated at the second electrode 209. In the detection phase, the control signal VG is an ON signal; the photosensitive thin film transistor 201 is turned on; and the processing circuit 211 reads from the photosensitive thin film transistor 201 via the read signal line the data voltage Vdata stored in the second capacitor 207, and analyzes it to form a fingerprint image.

In the above photo-sensing circuit, the photosensitive thin film transistor 201 has both a photosensitive function and a switching function, and thus a switching transistor may be omitted compared with the conventional photo-sensing circuit, which not only simplifies the circuit, but also saves layout area.

For example, the photo-sensing circuit 210 may detect visible light or infrared light, and the data voltage obtained from the detection and acquisition by the photo-sensing circuit 210 may be read by the processing circuit 211 for further processing to obtain a fingerprint image. The fingerprint image may be used for applications such as system unlocking, mobile payments, and the like. The processing circuit 211 may be a digital signal processor (DSP), a central processing unit, etc., and may also include a storage device if needed. The specific implementations of the photo-sensing circuit 210 and the processing circuit 211 are not limited by the embodiments of the present disclosure.

Figure 3C:
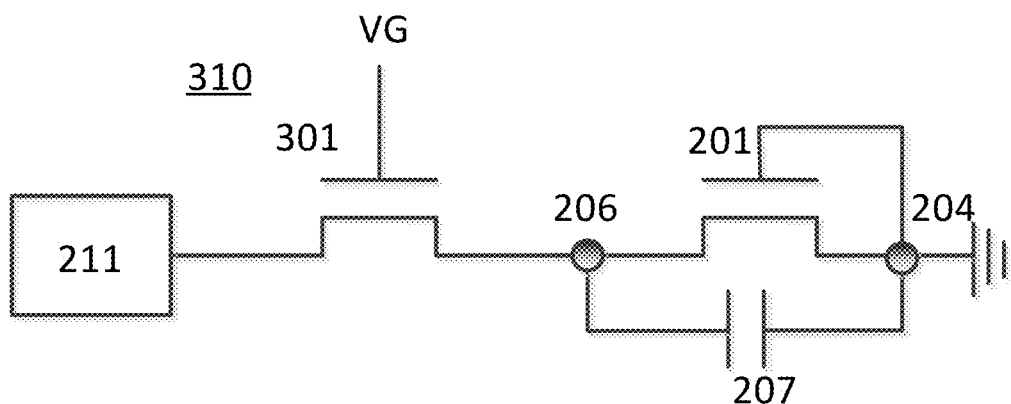
FIG. 3C is a schematic diagram of another photo-sensing circuit provided by an embodiment of the present disclosure.

It should be understood by those skilled in the art that a switching element may be additionally provided to form a photo-sensing circuit with the photosensitive thin film transistor 201. FIG. 3C shows a schematic view of another photo-sensing circuit according to an embodiment of the present disclosure. As shown, the photo-sensing circuit 310 includes a photosensitive thin film transistor 201, a switching transistor 301, and a second capacitor 207. The gate electrode of the photosensitive thin film transistor 201 is electrically connected to one of the first electrode 204 and the second electrode 206, and is also connected to a fixed potential, such that the photosensitive thin film transistor 201 is kept in an OFF state. For example, the gate electrode of the thin film transistor 201 is electrically connected to the first electrode 204, and is grounded in FIG. 3C. The first electrode of the switching transistor 301 is connected to the processing circuit 211; the second electrode of the switching transistor 301 is electrically connected to the second electrode 206 of the photosensitive thin film transistor 201; and the gate electrode of the switching transistor 301 is connected to the control signal VG.

A working process of the photo-sensing circuit 310 includes the following. In the reset phase, the control signal VG is an ON signal; the switching transistor 301 is turned on; and the processing circuit 211 writes a reset signal to the second capacitor 207 to reset the second capacitor 207. In the photosensitive phase, the control signal VG is an OFF signal; the switching transistor 301 is turned off; and the photosensitive thin film transistor 201 generates photo-generated carriers with the irradiation of the reflected light and charges the second capacitor 207, causing the second capacitor 207 to generate and store a data voltage Vdata. In the detection phase, the control signal VG is an ON signal; the switching transistor 301 is turned on; and the processing circuit 211 reads the data voltage Vdata stored in the second capacitor 207 through the photosensitive thin film transistor 201, and then analyzes it to form a fingerprint image. The details are not repeated here.

For example, the photosensitive region 200 may also be used to implement touch sensing, that is, to sense a user's touch. For example, when the user's finger touches the display panel 10, the light emitted by the light emitting structure 110 is reflected by the surface of the finger and then received by the photosensitive thin film transistor 201 of the photosensitive region 200, which converts it into an electrical signal. The external circuit, by detecting the electrical signal, may determine the touch of the finger, the direction of movement, etc., which are not described in details here.

According to an embodiment of the present disclosure, a method of fabricating the display panel 10 is provided, the method comprising: providing a substrate; and forming an array of pixels on the substrate, each pixel having a sub-pixel region and a photosensitive region; wherein the sub-pixel region comprises a light emitting structure; the photosensitive region is configured to sense light emitted by the light emitting structure and reflected by a finger; and the photosensitive region comprises a photosensitive thin film transistor having a vertical channel with respect to the substrate.

FIGS. 4A-4E are diagrams illustrating a process of a method of fabricating a display panel according to an embodiment of the present disclosure. The method for fabricating the display panel according to the embodiment of the present disclosure will be exemplified in the following with reference to FIGS. 4A-4E and FIG. 2. In the embodiments of the present disclosure, the same components are denoted by the same reference numerals.

For example, the manufacturing method includes the following steps S41-S45.

Figure 4A:
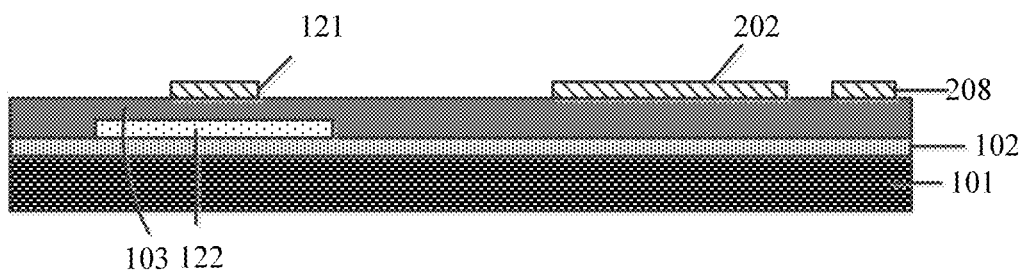
FIGS. 4A-4E are diagrams illustrating a process of a method of fabricating a display panel according to an embodiment of the present disclosure.

Step S41: as shown in FIG. 4A, forming a gate electrode 202 of a photosensitive thin film transistor 201.

For example, a first conductive material layer is formed on a substrate 101 and a patterned process is performed on the first conductive material layer to form the gate electrode 202.

For example, a gate 121 of a first transistor 120 may be formed together while forming the gate electrode 202.

For example, in order to form the first transistor 120, a buffer layer 102, an active layer 122 of the first transistor, and a gate insulating layer 103 may be sequentially formed on the substrate 101 before forming the gate electrode 202.

For example, a first electrode 208 of a first capacitor 207 may also be formed together while forming the gate electrode 202.

For example, the conductive material used to form the gate electrode 202 may be a metal such as gold (Au), silver (Ag), copper (Cu), aluminum (Al), molybdenum (Mo), magnesium (Mg), tungsten (W), or the like, an alloy material in which the metal is combined, or a conductive metal oxide material such as indium tin oxide (ITO), indium zinc oxide (IZO), zinc oxide (ZnO), zinc aluminum oxide (AZO), or the like.

For example, the substrate 101 may be an inorganic substrate (such as glass, quartz, sapphire, silicon wafer, etc.) or an organic flexible substrate (such as polyimide (PI), polyethylene terephthalate (PET), polycarbonate, polyethylene, polyacrylate, polyetherimide, polyethersulfone, etc.), which the embodiments of the present disclosure include, but are not limited to.

For example, the conductive material layer is patterned by a conventional photolithography process to form the gate electrode 202 of the thin film transistor 201, the gate 121 of the first transistor 120, and a first electrode 208 of a second capacitor 207, which are insulated from one another.

Figure 4B:
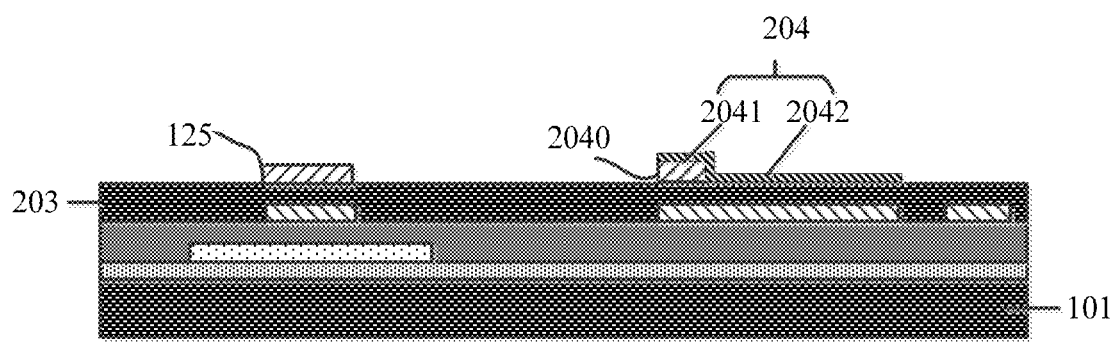

Step S42: as shown in FIG. 4B, sequentially forming a gate insulating layer 203, a first electrode lead 2040, and a first electrode 204 of the photosensitive thin film transistor 201 on the gate electrode 202.

For example, the gate insulating layer 203 may be an inorganic insulating material, which may be an oxide of silicon, a nitride of silicon or an oxynitride of silicon such as silicon oxide, silicon nitride, silicon oxynitride or the like, or may be an insulating material including metallic elements such as aluminum oxide, titanium nitride, or the like. For example, the gate insulating layer 203 may also be an organic insulating material such as acrylic acid or polymethyl methacrylate (PMMA).

For example, the first electrode lead 2040 is formed by forming a second conductive material layer and patterning the second conductive material layer.

For example, in order to cooperate with the pixel circuit forming the sub-pixel region, a first conductive layer 125 in the pixel circuit is also formed together while forming the first electrode lead 2040, and the first conductive layer 125 may be spaced apart from the gate 121 to form a first capacitor.

For example, the first electrode 204 is formed by forming a third conductive material layer and patterning the third conductive material layer. For example, the first electrode 204 includes a first portion 2041 overlaying the first electrode lead 2040 with respect to the substrate 101 to form a lapped structure, and a second portion 2042 disposed side by side with the first electrode lead 2040 with respect to the substrate 101. That is, the second portion 2042 is formed adjacent to the first electrode lead 2040 on the gate insulating layer 203. For example, the third conductive material layer is formed by a coating process, and the patterning process is dry etching.

For example, the third conductive material layer is a porous semiconductor electrode material. On one hand, the porous semiconductor electrode material is sparse and does not completely shield the electric field formed by applying a voltage to the gate electrode 202; on the other hand, the porous semiconductor electrode material has a moderate electronic density of states (DOS) such that it may conduct electricity, and, at the same time, allows the gate electrode 202 to regulate the charge injection to the active layer 205 by the first electrode 204. This property of the material allows control of the operational state of the photosensitive thin film transistor 201 by applying a voltage to the gate electrode. For example, the material of the first electrode 204 is carbon nanotubes. A plurality of carbon nanotubes is arranged to form a sparse structure. The carbon nanotubes not only have a pore-like structure, but also have gaps therebetween, which may reduce the shielding of the electric field formed by the voltage applied to the gate electrode; in the meantime, the carbon nanotubes, which are a semiconductor material having a moderate electronic density of states, allow the gate electrode 202 to regulate the charge injection to the active layer 205 by the first electrode 204 while conducting electricity, thereby allowing control of the operational state of the photosensitive thin film transistor 201 by applying a voltage to the gate electrode 202.

Figure 4C:
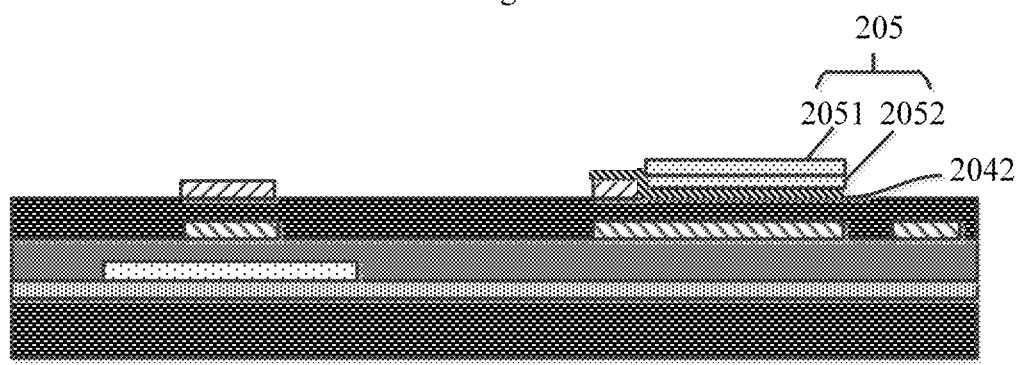

Step S43: forming an active layer 205 on the first electrode 204 as shown in FIG. 4C.

For example, in order to make the active layer 205 have a flat interface, the active layer 205 may be formed only on the second portion 2042 of the first electrode 204.

The active layer 205 includes a photosensitive layer 2051 that generates photo-generated carriers with irradiation of light, thereby converting the optical signal into the electrical signal. The photo-generated carriers are collected by a photo-sensing circuit, and then are converted into electrical signals output to an external processing circuit for analysis to obtain a fingerprint image.

For example, the photosensitive layer is a semiconductor material, and can generate an electric charge in the presence of the gate electric field. In this case, the photosensitive thin film transistor has both a photosensitive function and a switching function.

For example, in order to increase the signal intensity outputted by the photosensitive thin film transistor 201, the active layer 205 may further be provided with a semiconductor layer 2052. For example, as shown in FIG. 2, the semiconductor layer 2052 is disposed between the photosensitive layer 2051 and the first electrode 204. The semiconductor layer 2052 is configured to generate carriers under the electric field generated by the gate voltage, thereby increasing the signal intensity output from the photosensitive thin film transistor 201.

For example, the semiconductor layer 2052 may be disposed between the photosensitive layer 2051 and the second electrode 206. In his case, the semiconductor layer 2052 is made of a light transmissive material so that the photosensitive layer 2051 can receive and sense the light.

For example, a material of the photosensitive layer 2051 is poly(3-hexylthiophene) (P3HT), which is an organic material having both photosensitivity and semiconductor properties. To improve the photosensitivity of the P3HT material, it may be doped with [6,6]-phenyl-C 61-butyric acid methyl ester (PCBM), that is, the photosensitive layer 2051 is formed using a material of P3HT and PCBM composite.

For example, in order to improve the uniformity and stability of the photosensitive thin film transistor 201, the semiconductor layer 2052 is made of an amorphous semiconductor material. For example, the semiconductor layer 2052 is made of an organic semiconductor material, such as dinaphtho[2,3-b:2',3'-f]thieno[3,2-b]thiophene (DNTT) or pentacene.

For example, a semiconductor material layer and a photosensitive material layer are sequentially formed on the second portion 2042 of the first electrode 204, and the semiconductor material layer and the photosensitive material layer are patterned by a patterning process to form the photosensitive layer 2052 and the semiconductor layer 2051. For example, the patterning process includes dry etching to avoid corrosion and damage to the semiconductor material layer and the photosensitive material layer by the wet etching process.

Figure 4D:
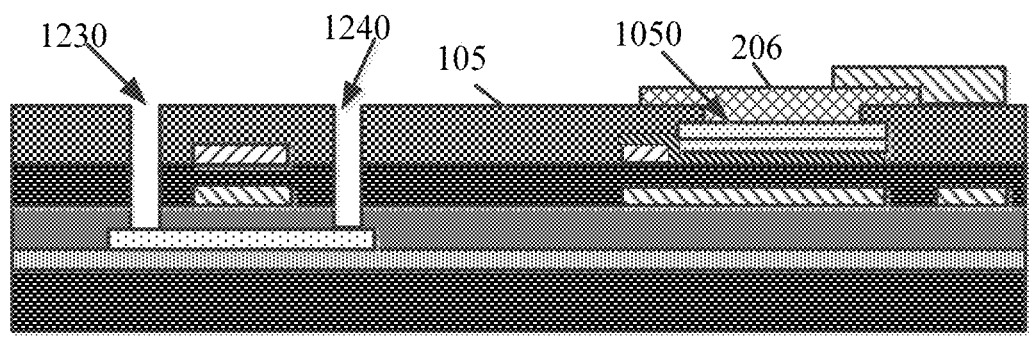

Step S44: as shown in FIG. 4D, sequentially forming an interlayer insulating layer 105 and a second electrode 206 on the active layer 205.

An opening 1050 is formed in the interlayer insulating layer 105 at a position corresponding to the active layer 205 to expose at least a portion of the active layer 205, and a second electrode 206 is formed to cover the active layer 205 exposed by the opening.

For example, a source contact hole 1230 and a drain contact hole 1240 of the first transistor are formed while forming the opening 1050, which expose the source region and the drain region of the active layer of the first transistor, respectively.

For example, the second electrode 206 is formed of a transparent conductive material through which the reflected light received reaches the active layer 205. By increasing the planar area of the second electrode 206, the photosensitive area of the photosensitive thin film transistor 201 can be increased, thereby improving the luminous flux and signal-to-noise ratio of the photosensitive thin film transistor 201. For example, the material of the second electrode 206 is an ultra-thin metal, carbon nanotubes, graphene, silver nanowires, or transparent oxide conductive material such as indium tin oxide (ITO), indium gallium zinc oxide (IGZO) or the like.

Step S45: forming a second electrode lead 2060.

Figure 4E:
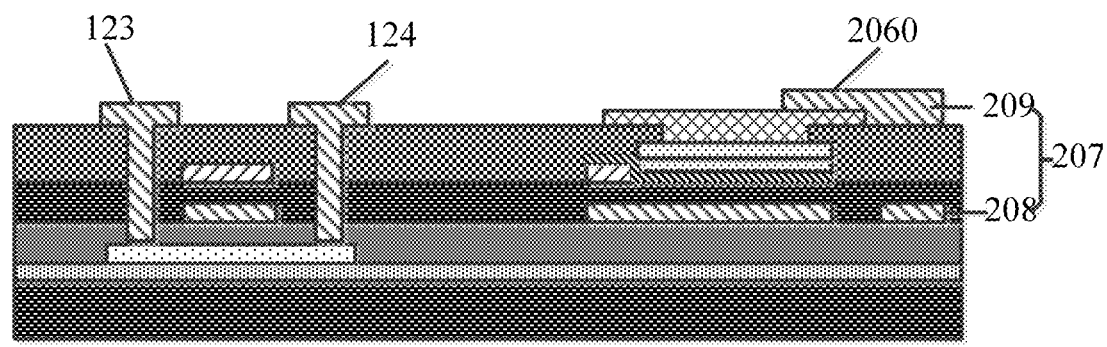

For example, as shown in FIG. 4E, the second electrode lead 2060 may be directly formed on and overlapped with the second electrode 206, that is, no intermediate layer is formed between the second electrode lead 2060 and the second electrode 206. However, it is possible to form an insulating layer between the second electrode lead 2060 and the second electrode 206, where the second electrode lead 2060 is electrically connected to the second electrode 206 through a via hole in the insulating layer, which is not limited by the embodiments of the present disclosure.

For example, a source or a source electrode 123 and a drain or a drain electrode 124 of the first transistor are formed together while the second electrode lead 2060 is formed, that is, the second electrode lead 2060, the source 123 and the drain 124 of the first transistor are formed by the same patterning process with the same conductive material. The source 123 and the drain 124 of the first transistor are electrically connected to the active layer of the first transistor through the source contact hole 1230 and the drain contact hole 1240, respectively.

For example, a second electrode 209 of the second capacitor 207 electrically connected to the second electrode lead 2060 is formed at the same time as the second electrode lead 2060. For example, as shown, the second electrode 209 is integrally formed with the second electrode lead 2060.

Accordingly, the above-described photosensitive thin film transistor 201 having a vertical channel is formed.

Then, an insulating layer 140 is formed, and a first electrode 111, a light emitting layer 112, and a second electrode 113 of a light emitting structure 110 are sequentially formed to form the light emitting structure 110.

For example, a pixel defining layer is formed before the light emitting layer 112 is formed. Since the pixel defining layer is generally opaque, an opening in the pixel defining layer is formed at a position corresponding to the photosensitive thin film transistor 201 such that the light is not blocked from radiating the photosensitive thin film transistor. For example, the opening may be formed simultaneously with an aperture of the pixel defining layer corresponding to the light emitting structure.

For example, an encapsulation layer may be formed on the array substrate obtained above to seal the light emitting structure, details of which are not described herein.

The method of fabricating a display panel according to the embodiments of the present disclosure includes forming a photosensitive region by using a photosensitive thin film transistor having a vertical channel. The photosensitive thin film transistor having a relatively large photosensitive area (or a large aperture ratio) and a relatively short channel length. Thus, the light responsivity and signal-to-noise ratio of the display panel may be improved. In at least one embodiment, the photosensitive thin film transistor may be compatible with the fabrication process of the pixel circuit, for example, in the fabrication method according to the above embodiments, the formation of the photosensitive thin film transistor requires only three additional patterning processes of forming the first electrode 204, the active layer 205, and the second electrode 206, and other structural layers may be fabricated together with the structures of the pixel circuit, thereby simplifying the fabrication process and reducing the cost.

Various embodiments and/or examples are disclosed to provide exemplary and explanatory information to enable a person of ordinary skill in the art to put the disclosure into practice. Features or components disclosed with reference to one embodiment or example are also applicable to all embodiments or examples unless specifically indicated otherwise.

Although the disclosure is described in combination with specific embodiments, it is to be understood by the person skilled in the art that many changes and modifications may be made and equivalent replacements may be made to the components without departing from a scope of the disclosure. Embodiments may be practiced in other specific forms. The described embodiments are to be considered in all respects only as illustrative and not restrictive.

The invention claimed is:

1. A display panel comprising:
a substrate; and
an array of pixels on the substrate, each pixel having a sub-pixel region and a photosensitive region,
wherein the sub-pixel region comprises a light emitting structure;
the photosensitive region is configured to sense light emitted by the light emitting structure and reflected by a finger;
the photosensitive region comprises a photosensitive thin film transistor having a vertical channel with respect to the substrate;
the photosensitive thin film transistor comprises a gate electrode, a gate insulating layer, a first electrode, an active layer, and a second electrode sequentially formed over the substrate; and
the active layer comprises a photosensitive layer.

2. The display panel according to claim 1, further comprising an insulating layer over the photosensitive thin film transistor, wherein the light emitting structure is disposed over the insulating layer.

3. The display panel according to claim 1, wherein the photosensitive layer comprises a material of poly(3-hexyl-thiophene) (P3HT) and [6,6]-phenyl-C 61-butyric acid methyl ester (PCBM) composite.

4. The display panel according to claim 1, wherein the active layer further comprises a semiconductor layer between the photosensitive layer and the first electrode.

5. The display panel according to claim 4, wherein the semiconductor layer comprises dinaphtho[2,3-b:2',3'-f]thieno[3,2-b]thiophene (DNTT) or pentacene.

6. The display panel according to claim 1, wherein a material of the first electrode is a porous semiconductor electrode material.

7. The display panel according to claim 6, wherein a material of the first electrode is carbon nanotubes.

8. The display panel according to claim 1, wherein a material of the second electrode is a transparent conductive material.

9. The display panel according to claim 1, wherein the photosensitive region further comprises a first electrode lead electrically connected to the first electrode; and
the first electrode comprises a first portion and a second portion, the first portion covering the first electrode lead with respect to the substrate, the second portion and the first electrode lead being arranged side by side with respect to the substrate.

10. The display panel according to claim 1, wherein the sub-pixel region further comprises a first transistor, and a source or a drain of the first transistor is electrically connected to a first electrode of the light emitting structure.

11. The display panel according to claim 10, wherein a gate of the first transistor is in a same layer as the gate electrode of the photosensitive thin film transistor.

12. The display panel according to claim 10, wherein the photosensitive region further comprises a second electrode lead electrically connected to the second electrode of the photosensitive thin film transistor, and the second electrode lead is in a same layer as the source or the drain of the first transistor.

13. The display panel according to claim 10, wherein the photosensitive thin film transistor is distal from the substrate relative to an active layer of the first transistor.

14. The display panel according to claim 1, wherein the sub-pixel region comprises a plurality of sub-pixels, each sub-pixel having a size substantially equal to a size of the photosensitive region.

15. The display panel according to claim 1, further comprising a filter layer over the second electrode of the photosensitive thin film transistor, the filter layer covering the photosensitive thin film transistor.

16. A method of fabricating a display panel comprising:
providing a substrate; and
forming an array of pixels on the substrate, each pixel having a sub-pixel region and a photosensitive region;
wherein the sub-pixel region comprises a light emitting structure;
the photosensitive region is configured to sense light emitted by the light emitting structure and reflected by a finger;
the photosensitive region comprises a photosensitive thin film transistor having a vertical channel with respect to the substrate;
the photosensitive thin film transistor comprises a gate electrode, a gate insulating layer, a first electrode, an active layer, and a second electrode sequentially formed over the substrate; and
the active layer comprises a photosensitive layer.

17. The method according to claim 16, further comprising:
forming an insulating layer over the photosensitive thin film transistor; and
forming the light emitting structure over the insulating layer.

18. The method according to claim 16, further comprising:
forming the photosensitive thin film transistor by sequentially forming a gate electrode, a gate insulating layer, a first electrode, an active layer, and a second electrode over the substrate.

* * * * *